(12) United States Patent
Abeles et al.

(10) Patent No.: US 6,888,984 B2
(45) Date of Patent: May 3, 2005

(54) AMORPHOUS SILICON ALLOY BASED INTEGRATED SPOT-SIZE CONVERTER

(75) Inventors: Joseph H. Abeles, East Brunswick, NJ (US); Nagendranath Maley, Exton, PA (US); Ralph Doud Whaley, Jr., Princeton Junction, NJ (US); Liyou Yang, Plainsboro, NJ (US)

(73) Assignee: Sarnoff Corporation, Princeton, NJ (US)

(*) Notice: Subject to any disclaimer, the term of this patent is extended or adjusted under 35 U.S.C. 154(b) by 37 days.

(21) Appl. No.: 10/216,936

(22) Filed: Aug. 12, 2002

(65) Prior Publication Data

US 2003/0165293 A1 Sep. 4, 2003

Related U.S. Application Data

(60) Provisional application No. 60/360,358, filed on Feb. 28, 2002.

(51) Int. Cl.[7] .................... G02B 6/26; G02B 6/30; G02B 6/32; H01L 21/00
(52) U.S. Cl. .................... 385/33; 385/49; 385/124; 385/129; 385/131; 438/87; 438/37; 438/96
(58) Field of Search ............ 438/87, 37, 96; 385/33–35, 49, 129–132, 124; 359/652–654

(56) References Cited

U.S. PATENT DOCUMENTS

| | | | |
|---|---|---|---|
| 3,801,181 A | * 4/1974 | Kitano et al. ............... 359/652 |
| 3,875,532 A | 4/1975 | Kobayashi et al. .... 331/94.5 H |
| 3,894,789 A | 7/1975 | Kobayashi et al. ........ 350/96 C |
| 4,278,322 A | 7/1981 | Mahlein ................. 350/96.18 |
| 4,640,585 A | 2/1987 | Nojiri ......................... 350/413 |
| 4,668,053 A | 5/1987 | Nishi et al. ................ 350/413 |
| 4,695,122 A | 9/1987 | Ishida et al. .............. 350/96.12 |
| 6,163,631 A | 12/2000 | Kawanishi et al. ............ 385/14 |
| 6,253,004 B1 | 6/2001 | Lee et al. ....................... 385/31 |
| 2002/0164119 A1 | * 11/2002 | Bryan et al. ................... 385/33 |
| 2003/0044118 A1 | * 3/2003 | Zhou et al. .................... 385/43 |
| 2003/0096098 A1 | * 5/2003 | Ovshinsky et al. ....... 428/310.5 |
| 2003/0117691 A1 | * 6/2003 | Bi et al. ....................... 359/333 |
| 2003/0118841 A1 | * 6/2003 | Horne et al. .............. 428/425.9 |

FOREIGN PATENT DOCUMENTS

| | | |
|---|---|---|
| DE | 196 13 755 | 10/1997 |
| EP | 384 849 | 8/1990 |
| WO | WO 99/15928 | 4/1999 |
| WO | WO 02/091051 | 11/2002 |

OTHER PUBLICATIONS

60/288,533.*
60/313,588.*
Melles Griot "The Practical Application of Light" 1999, pp. 1.2–1.7, 1.23–1.24, 15.16–15.18.*
Shimada, J–i, et al, "Integrated Coupling Device Between a Laser Diode and an Optical Fiber Using a Microlens" Electronics & Communications in Japan, Part II—Electronics, Scripta Technica, New York, US, vol. 77, No. 8:45–53 (1994).

* cited by examiner

Primary Examiner—Edward J. Glick
Assistant Examiner—Krystyna Suchecki
(74) Attorney, Agent, or Firm—William J. Burke

(57) ABSTRACT

A photonic device suitable for being optically coupled to at least one optical fiber having a first spot-size, the device including: at least one photonic component; and, a graded index lens optically coupled between the at least one photonic component and the at least one optical fiber; wherein, the graded index lens is adapted to convert optical transmissions from the at least one photonic component to the first spot size.

25 Claims, 4 Drawing Sheets

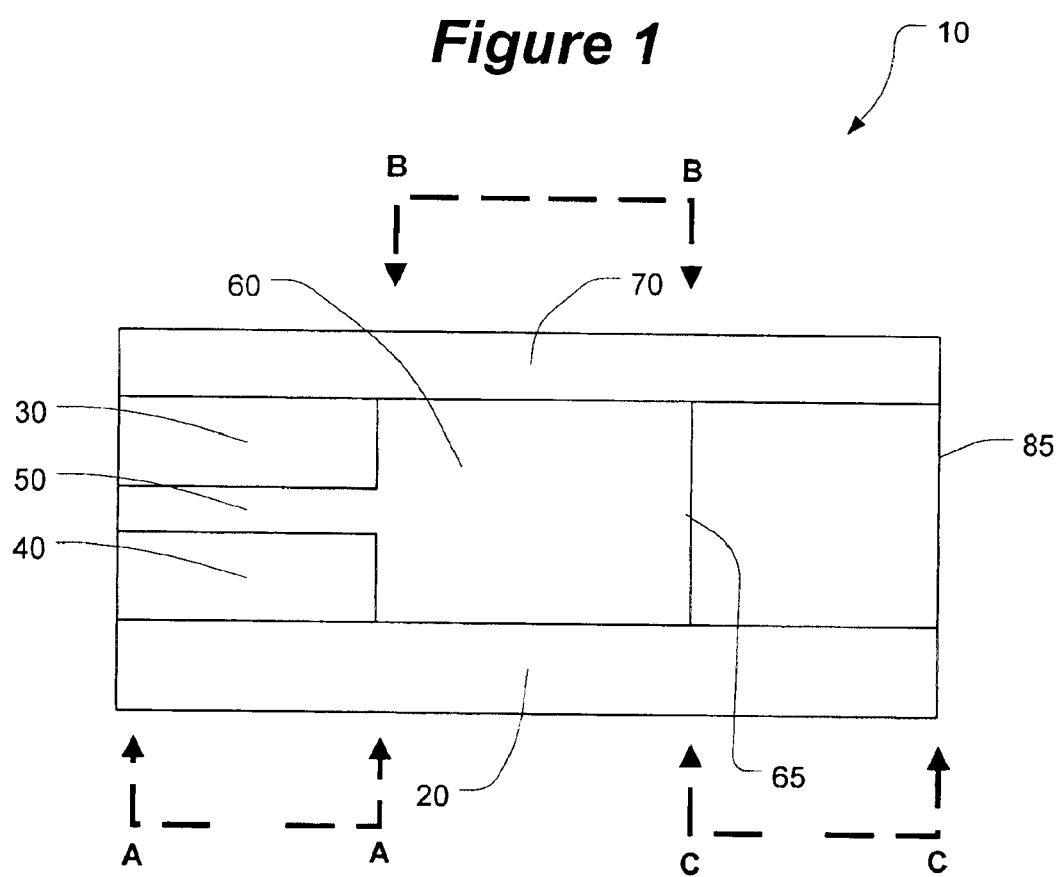

AMORPHOUS SILICON ALLOY BASED INTEGRATED SPOT-SIZE CONVERTER

RELATED APPLICATIONS

This Application claims priority of U.S. patent application Ser. No. 60/360,358, filed Feb. 28, 2002, entitled AMORPHOUS SILICON ALLOY BASED INTEGRATED SPOT SIZE CONVERTER, the entire disclosure of which is hereby incorporated by reference as if being set forth in its entirety herein.

FIELD OF INVENTION

The present invention relates generally to opto-electronic devices, and particularly to spot size converters suitable for use with opto-electronic devices.

BACKGROUND OF THE INVENTION

Type III–V semiconductor compound devices are typically used in optical communications networks utilizing optical fibers as transport mediums. Each of these devices may typically be connected to at least one optical fiber. It is desirable to obtain efficient power coupling of transmissions between such opto-electronic devices and optical fibers.

However, such semiconductor devices may typically have small mode sizes ($\leq$ approximately 1 $\mu$m in the transverse direction, for example). This relatively small mode size of the semiconductor device may tend to impair coupling into optical fibers resulting in losses that represent a significant part of the optical power budget in an optical network. Further, the mode shape of a glass fiber may be largely symmetrical, while the mode shape of such a semiconductor device may be largely asymmetrical. This shape mismatch may also lead to losses.

Accordingly, it is highly desirable to provide for an improved system and method for providing optical coupling between photonic components and optical fibers.

SUMMARY OF THE INVENTION

A photonic device suitable for being optically coupled to at least one optical fiber having a first spot-size, the device including: at least one photonic component; and, a graded index lens optically coupled between the at least one photonic component and the at least one optical fiber; wherein, the graded index lens is adapted to convert optical transmissions from the at least one photonic component to the first spot size.

BRIEF DESCRIPTION OF THE FIGURES

Understanding of the present invention will be facilitated by consideration of the following detailed description of the preferred embodiments of the present invention taken in conjunction with the accompanying drawings, wherein like numerals refer to like parts and in which:

FIG. 1 illustrates a cross-sectional view of a photonic system incorporating a spot-size converter according to an aspect of the present invention;

DETAILED DESCRIPTION OF THE PREFERRED EMBODIMENTS

Figure 2A:
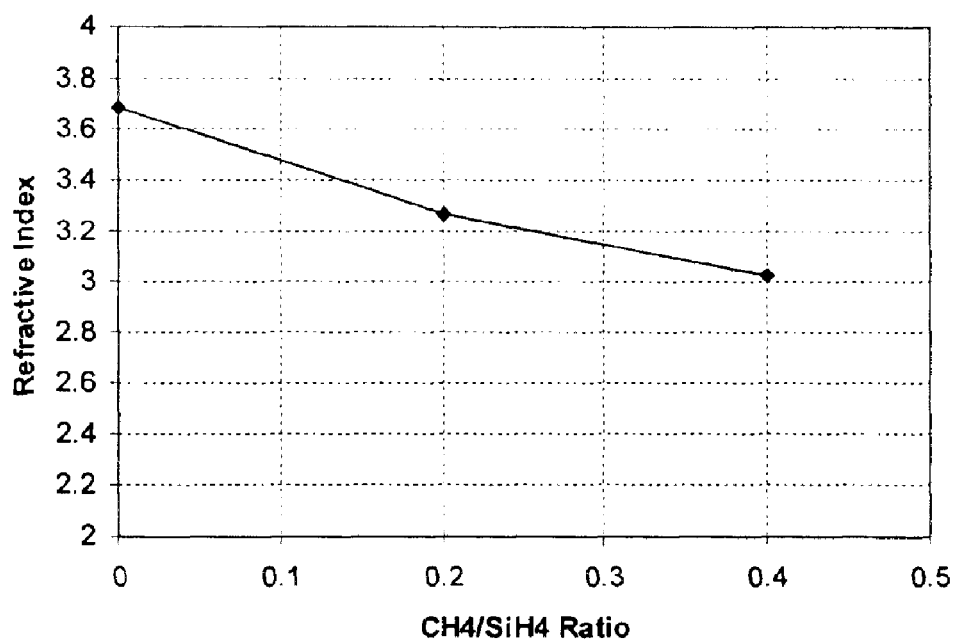
FIGS. 2a and 2b illustrate refractive indices of a series of a-SiN$_x$ films which may be made by varying a N$_2$/SiH$_4$ ratio and a-SiC$_x$ films which may be made using a SiH$_4$+CH$_4$+H$_2$ gas mixture in PECVD processes, respectively; and, FIGS. 3a and 3b illustrate a launched eigenmode and expanded mode according to an aspect of the present invention.

It is to be understood that the figures and descriptions of the present invention have been simplified to illustrate elements that are relevant for a clear understanding of the present invention, while eliminating, for purposes of clarity, many other elements found in typical opto-electronic devices, semiconductor optical waveguides and manufacture methods relating thereto. Those of ordinary skill in the art will recognize that other elements are desirable and/or required in order to implement the present invention. However, because such elements are well known in the art, and because they do not facilitate a better understanding of the present invention, a discussion of such elements is not provided herein. The disclosure herein is directed to all such variations and modifications to such devices, waveguides and methods known to those skilled in the art.

According to an aspect of the present invention, type III–V semiconductor device to optical fiber spot-size conversion may be achieved using an integrated lens, such as a Graded Index (GRIN) lens, in which the refractive index varies such that it is highest near the peak of the mode corresponding to the semiconductor device and decreases quadratically from that value as a function of transverse position. Such a lens may serve to capture light emanating from the semiconductor waveguide particularly with respect to the transverse mode profile: owing to the small spot size dimension in the transverse dimension, the light emanates from the waveguide with a wide-angle radiation pattern such that it is typically difficult to capture the light efficiently. However, using such a lens, a wide angle transverse radiation pattern may be converted to a narrower angle radiation pattern.

According to an aspect of the present invention, an a-Si based alloy material integrated quadratic-graded index (GRIN) lens may be used. According to an aspect of the present invention, a-Si based alloy materials may also be utilized to form waveguides for coupling type III–V semiconductor compound devices and such spot-size converters to optical fibers. Of course other suitable materials may be used to fabricate such a GRIN lens.

Referring now to FIG. 1, there is shown a system 10 incorporating spot-size conversion according to an aspect of the present invention. System 10 generally includes device region A, spot-size converter region B and waveguiding region C. It should be understood that while FIG. 1 illustrates spot-size converter region B optically interposed between device region A and waveguiding region C, this is for non-limiting sake of illustration only. That is, waveguiding region C may be interposed between device region A and spot-size converter region B. Further, waveguiding region C may be omitted, as will be evident from the following description.

Device region A may generally include one or more type III–V semiconductor compound based photonic devices, such as an active device like a semiconductor laser for example, or a passive device such as a waveguide based splitter/combiner for example. The present invention will be further discussed with regard to a single active device for non-limiting explanatory purposes only. Such a device may, for example, include InP layers 30, 40, having an InGaAsP core 50 interposed there between, being formed upon an InP substrate 20. An overcoat dielectric layer 70 may, or may not, be provided. The manufacture and operation of such devices is well understood by those possessing an ordinary skill in the pertinent arts. Region A may have a spot-size corresponding to the core 50 on the order of $\leq$ approximately 1 $\mu$m. However, as set forth, it may be desirable to optically couple region A to an optical fiber having a spot-size on the order of $\geq$ approximately 5 $\mu$m.

Spot-size converter region B generally includes a layered Graded Index (GRIN) lens 60 optically coupled to core 50 of the type III–V semiconductor compound based photonic component of region A. As set forth, converter region B may be optically coupled, either in lieu of region A or in addition to region A, to waveguiding region C. Spot-size converter region B serves to convert optical transmissions traversing it between the spot-size of device region A (e.g., $\leq$ approximately 1 $\mu$m) and a spot-size corresponding to an optical fiber which it may be optically communicable with (e.g., $\geq$ approximately 5 $\mu$M). GRIN lens 60 may have a graded index profile varying from n=3.5 at the core to n=3.3 at its outermost edges, for example. Dielectric layer 70 may overcoat region B and have a refractive index approximately that of the outermost edge of GRIN lens 60, such as n=3.3. Of course, other values of index can be used; a relevant consideration being the quadratic variation of index with position along the transverse direction.

As will be understood by those possessing an ordinary skill in the pertinent arts, highly efficient transverse mode conversion using such a converter region B may be achieved. For example, a standard InGaAsP 0.2 $\mu$m active region core 50 with a refractive index of n=3.5 and 3 $\mu$m of upper and lower InP cladding having a refractive index of n=3.17 may provide transmissions being incident upon a transverse graded index (GRIN) lens having an index profile of approximately:

$$n^2(x) = n^2(0)(1-(gx)^2)$$

where n(x) is the refractive index as a function of transverse position, n(0) is the central index, and g is the lens curvature given by $$g = \frac{\sqrt{\Delta n}}{a},$$

where a is the distance between the core and cladding (lens radius), and $\Delta n = [n^2(0) - n^2_c]/n^2(0)$, the relative refractive index. The use of a dielectric overcoat 70, of n=3.3, equal to the lens 60 edge index, may prevent a large index step between the lens and air that may otherwise result in strong reflection and mode destruction. As will be understood by those possessing an ordinary skill in the pertinent arts, GRIN lens 60 may have a length corresponding to a mode expansion desired and the graded index profile, for example.

Figure 3A:
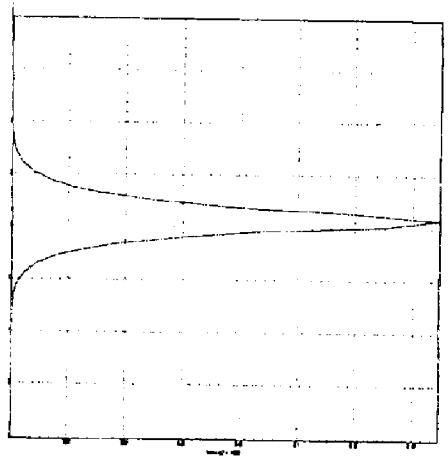
Figure 3B:
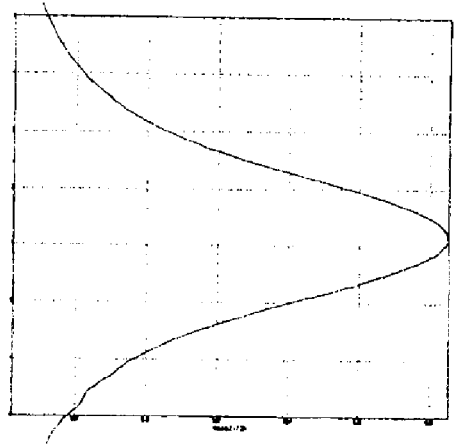

Referring now to FIGS. 3a and 3b, there are shown field intensity plots corresponding to the system 10. The eigenmode of the InP/InGaAsP/InP waveguide may have a Full Width Half Maximum (FWHM) beam waist of 0.85 $\mu$m. The field intensity map of amorphous silicon GRIN lens 60 may have an expanded mode with a beam waist of 3.1 $\mu$m. The launched eigenmode is shown in FIG. 3a and expanded mode is shown in FIG. 3b. Ripples on the lower right in FIG. 3b may correspond to reflections from the lens/substrate interface, for example.

Referring again to FIG. 1, waveguiding region C may generally include an a-Si material based alloy waveguide optically coupled between core 50 of region A and at least one optical fiber to which device region A is to be in optical communication with. As set forth, waveguiding region C may be omitted altogether, or optically interposed between regions A and B, for example. Waveguiding region C may have a refractive index between the refractive index of the core and outermost edge of GRIN lens 60, e.g., between n=3.5 and n=3.3. Waveguiding region C may have a refractive index statistically related to the refractive index profile of GRIN lens 60 at an interface 65 of GRIN lens 60 and region C For example, waveguiding region C may have a refractive index approximately that of the average of the refractive index profile of GRIN lens 60 at interface 65 between GRIN lens 60 and waveguiding region C. Waveguiding region C may further include an interface 85 being suitable for coupling to one or more optical fibers.

According to an aspect of the present invention, regions B and/or C may be fabricated of an a-Si based alloy material, such as an a-Si:H or a-Si:F alloy, using Plasma Enhanced Chemical Vapor Deposition (PECVD). In the case of such PECVD deposited a-Si materials, optical absorption at an operating wavelength of 1.55 $\mu$m may be desirably low, leading to low loss and good optical transmission properties as will be understood by those possessing an ordinary skill in the pertinent arts. The optical properties of amorphous silicon (including the refractive index and optical absorption in visible and near-IR wavelengths) may be varied by alloying the primary deposition gas with germanium, carbon, nitrogen, or other elements, and the material can be easily doped with boron or phosphorous for example.

According to an aspect of the present invention, amorphous silicon (a-Si) based alloy materials which may be utilized in forming regions B and/or C may include a-Si:H and a-Si:F based alloys, such as a-SiC$_x$ where 0<x<1, a-SiN$_y$, where 0<y<1.33, a-SiO$_z$ where 0<z<2 and a-SiGe$_w$ where 0<w<1.

Such a-Si based regions may provide for ready integration and interconnection of type III–V semiconductor compound based devices for coupling to optical fibers. This results from several properties, including for example: low optical losses of approximately 0.2 cm$^{-1}$ at 1550 nm; a wide range of tunability of refractive index through composition management, the ability to match the refractive index of type III–V semiconductor waveguides, and significantly exceed it if desired, and the ability to deposit high-quality, low-stress, layered structures through plasma enhanced chemical vapor deposition (PECVD) techniques. In addition to lowering coupling loss, such an index-matched spot-size converter may also serve to reduce interface reflection and stray light-induced device performance degradation, such as the corruption of an analog channel for example. Further, such materials may be etched using fluorine-based plasmas, which offer good selectivity relative to InP for example.

Further, the use of such PECVD films offers a great deal of flexibility in designing spot-size converters through composition and refractive index grading. Table 1 illustrates examples of how films with a refractive index ranging from 2.4 to 3.7 can be deposited in a single system through a suitable choice of gases and their flow ratios.

TABLE 1

| Material | Gases | N/Si, C/Si ratio in film | Refractive index |
|---|---|---|---|
| Silicon rich nitride | SiH$_4$, N$_2$ | 0.05–1.0 | 2.4–3.7 |
| Silicon carbide | SiH$_4$, CH$_4$ | 0–1.0 | 2.6–3.7 |

Figure 2B:
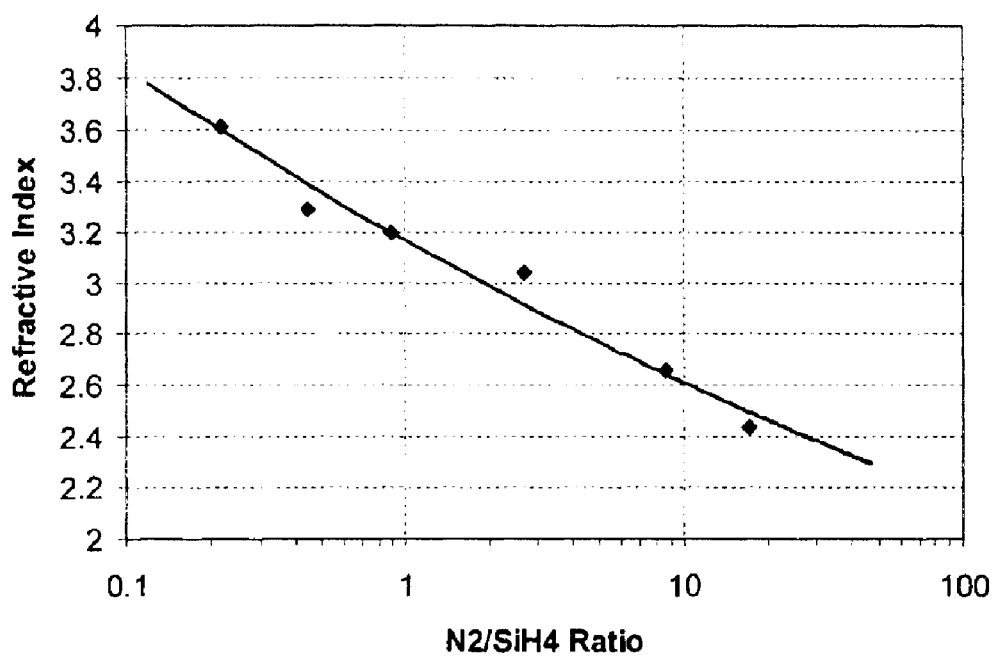

Referring now to FIG. 2a, there is shown a chart illustrating achievable refractive indices as a function of a ratio of CH$_4$ to SiH$_4$ used in a PECVD process to form a waveguide including a-SiC$_x$. Referring now also to FIG. 2b, there is shown a chart illustrating achievable refractive indices as a function of a ratio of N$_2$ to SiH$_4$ used in a PECVD process to form a material including a-SiN$_x$. Over this range of refractive indices, it is possible to grow films with very low optical loss (<approximately 0.5 dB/cm for example) in the 1.5 $\mu$m region.

A layer with a predefined vertical graded index profile may be deposited by varying, such as by continuously varying, the flow ratio of the source gases according to the desired profile. For accurate refractive index control to within a percent, premixing of source gases (e.g., $SiH_4$ and $N_2$) may be used to improve reproducibility of a baseline composition. An additional variable source, either $SiH_4$ or $N_2$, with an appropriately sized precision flow controller, may be used to provide accurate index grading relative to the baseline composition.

While PECVD films may typically be less than 2 μm thick, spot-size converter region B may require layer thicknesses in the range of 5–10 μm. However, such PECVD processes are generally well suited for thick film applications as a high deposition rate (~5 μm/hr) may be obtained and stress in the film may be controlled over a wide range, from tensile to compressive, by adjusting deposition parameters such as pressure and inert gas dilution for example.

If required for better control of the mode characteristics at a cleaved edge of a chip used to implement the present invention (e.g. interface 65 or 85), the graded index (GRIN) lens 60 may be etched at a point corresponding to an optimum point for mode expansion/contraction in the longitudinal direction, for example. An index matched a-Si waveguiding region C may then be deposited at this etched chip edge to maintain the expanded mode shape for coupling into an optical fiber, for example.

As will be recognized by those possessing an ordinary skill in the pertinent arts, such a graded index lens may provide for mode expansion primarily in a vertical direction, relative to an underlying substrate, for example. Such expansion in the vertical direction may be enhanced with other conventional techniques known to those possessing an ordinary skill in the pertinent arts for expanding the mode in a lateral direction, relative to the same substrate for example. Such techniques include, for example, tapering of active and passive waveguides, such as is disclosed in U.S. Pat. No. 6,253,009, entitled SEMICONDUCTOR OPTICAL COMPONENT COMPRISING A SPOT-SIZE CONVERTER, the entire disclosure of which is hereby incorporated by reference as if being set forth in its entirety herein. Further, active and passive waveguides may be superimposed so as to create a damped vertical coupling region having the width of the active waveguide gradually taper down to deconfine a traversing mode, while the width of the passive waveguide increases more rapidly to some constant. When a traversing mode becomes deconfined it may exhibit improved transit to the passive guide, as compared to conventional butt coupling techniques for example.

In such a case, where vertical and lateral mode expansion may be somewhat independently provided for, losses associated with mode shape mismatches may also be at least partially mitigated, as the expanded mode shape may be analogously altered.

It will be apparent to those skilled in the art that various modifications and variations may be made in the apparatus and process of the present invention without departing from the spirit or scope of the invention. Thus, it is intended that the present invention cover the modification and variations of this invention provided they come within the scope of the appended claims and their equivalents.

What is claimed is:

1. A photonic device suitable for being optically coupled to at least one optical fiber having a first spot-size, said device comprising:
   at least one photonic component; and,
   a graded index lens optically coupled between said at least one photonic component and said at least one optical fiber;
   wherein, said graded index lens comprises at least one amorphous silicon based material having a varying index of refraction between about 2.4 and about 3.7, and is adapted to convert optical transmission from said at least one photonic component to said first spot size.

2. The device of claim 1, wherein said first spot-size is $\geq$ approximately 5 μm.

3. The device of claim 2, wherein said photonic component has a second spot-size $\leq$ approximately 1 μm.

4. The device of claim 3, wherein said at least one photonic component comprises at least one type III–V semiconductor compound based photonic component.

5. The device of claim 4, wherein, said graded index lens is further adapted to convert optical transmissions from said optical fiber to said second spot size.

6. The device of claim 1, wherein said graded index lens has an index profile that varies quadratically as a function of transverse position.

7. The device of claim 6, wherein a refractive index at an outermost edge of said graded index lens is less than a refractive index at at least one other transverse position.

8. The device of claim 1, wherein said amorphous silicon based material comprises at least one a-Si:H or a-Si:F based alloy.

9. The device of claim 1, wherein said at least one amorphous silicon based material comprises at least one material selected from the group consisting essentially of: a-SiC$_x$ where 0<x<1, a-SiN$_y$ where 0<y<1.33, a-SiO$_z$ where 0<z<2 and a-SiGe$_w$ where 0<w<1.

10. The device of claim 1, further comprising at least one waveguide optically coupled to said graded index lens.

11. The device of claim 10, wherein said graded index lens includes first and second refractive indices and said waveguide has a refractive index greater than said first refractive index of said graded index lens and less than said second refractive index of said graded index lens.

12. The device of claim 10, wherein said graded index lens has a refractive index profile and said waveguide has a refractive index approximately equal to an average of said refractive index profile of said graded index lens.

13. The device of claim 10, wherein said graded index lens and waveguide each comprise at least one amorphous silicon based alloy material.

14. The device of claim 10, wherein said graded index lens and waveguide each comprise at least one a-Si:H or a-Si:F based alloy.

15. The device of claim 14, wherein said at least one amorphous silicon based alloy material comprises at least one material selected from the group consisting essentially of: a-SiC$_x$ where 0<x<1, a-SiN$_y$ where 0<y<1.33, a-SiO$_z$ where 0<z<2 and a-SiGe$_w$ where 0<w<1.

16. The device of claim 1, wherein said graded index lens comprises a quadratic graded index lens.

17. The device of claim 1, further comprising cladding adjacent to at least said graded index lens.

18. The device of claim 17, wherein said graded index lens has a refractive index n(x) as a function of transverse position where: $n^2(x) = n^2(0)(1-(gx)^2)$, $n(0)$ is the central index, and g is the lens curvature $$g = \frac{\sqrt{\Delta n}}{a},$$

where a is the lens radius, and the relative refractive index $\Delta n = [n^2(0) - n^2_c]/n^2(0)$, and $n_c$ is the refractive index of said cladding.

19. The device of claim 1, wherein said graded index lens is at least partially laterally tapered.

20. A method for optically coupling at least one photonic device having a first spot-size to at least one optical fiber having a second spot-size, said method comprising forming a graded index lens including at least one amorphous silicon based material having a varying index of refraction between about 2.4 and about 3.7, and being adapted to convert optical transmissions from said first-spot size to said second spot-size so as to be integrated with said at least one photonic device; wherein; said graded index lens is adapted to be optically coupled between said at least one photonic device and optical fiber.

21. The method of claim 20, wherein said amorphous silicon based alloy material comprises at least one a-Si:H or a-Si:F based alloy.

22. The method of claim 20, wherein said at least one amorphous silicon based alloy material comprises at least one material selected from the group consisting essentially of: $a\text{-}SiC_x$ where $0<x<1$, $a\text{-}SiN_y$ where $0<y<1.33$, $a\text{-}SiO_z$ where $0<z<2$ and $a\text{-}SiGe_w$ where $0<w<1$.

23. The method of claim 20, wherein said forming comprises plasma enhanced chemical vapor depositing said amorphous silicon based alloy material in a varying manner.

24. The method of claim 20, wherein said at least one graded index lens is at least partially laterally tapered.

25. The method of claim 20, wherein said forming comprises plasma enhanced chemical deposition processing using:

at least a first gas to provide at least one baseline refractive index for said graded index lens; and, at least a second gas to vary said at least one baseline refractive index as a function of transverse position.

* * * * *